United States Patent [19]

Hass et al.

[11] Patent Number: 5,359,489
[45] Date of Patent: Oct. 25, 1994

[54] ELECTRONIC CONTROL MODULE ASSEMBLY WITH PIVOTABLE CONNECTOR

[75] Inventors: Jürgen Hass, Erzhausen; Josef Woller, Griesheim, both of Fed. Rep. of Germany

[73] Assignee: The Whitaker Corporation, Wilmington, Del.

[21] Appl. No.: 994,562

[22] Filed: Dec. 21, 1992

[30] Foreign Application Priority Data

Dec. 30, 1991 [GB] United Kingdom ............... 9127466

[51] Int. Cl.⁵ .................... H05K 7/02; H01R 13/62
[52] U.S. Cl. .................. 361/732; 439/341; 439/376
[58] Field of Search ............ 361/608, 610, 725–727, 361/730, 732, 733, 740, 741, 747, 755, 756, 759, 807, 809, 810; 439/76, 341, 342, 345, 372, 377, 476, 483, 484, 905, 928, 376

[56] References Cited

U.S. PATENT DOCUMENTS 3,668,605  6/1972  Albert .................... 439/341
4,821,145  4/1989  Corfits et al. ............ 361/800 X
5,253,140  10/1993 Inoue et al. ............. 439/341 X Primary Examiner—Leo P. Picard
Assistant Examiner—Michael W. Phillips
Attorney, Agent, or Firm—Eric J. Groen; Adrian J. LaRue

[57] ABSTRACT

An electronic control assembly has a control box, a control module insertable into the control box and an electrical connector which is pivotally mounted within the box, between a position where the control module can be inserted into the box adjacent to the connector and between a position where the electrical connector is in electrical engagement with the electronic module. The electrical connector is pivotally mounted in the control box and includes a lower mounting leg having outer pinion portions which are positioned in a trunnion located in adjacent side walls forming a channel for the receipt of the connector and the module. The electronic module is in precise registration with the connector member, such that when the connector is pivoted into place, the electrical elements within the connector and the electronic module are in precise alignment.

30 Claims, 13 Drawing Sheets

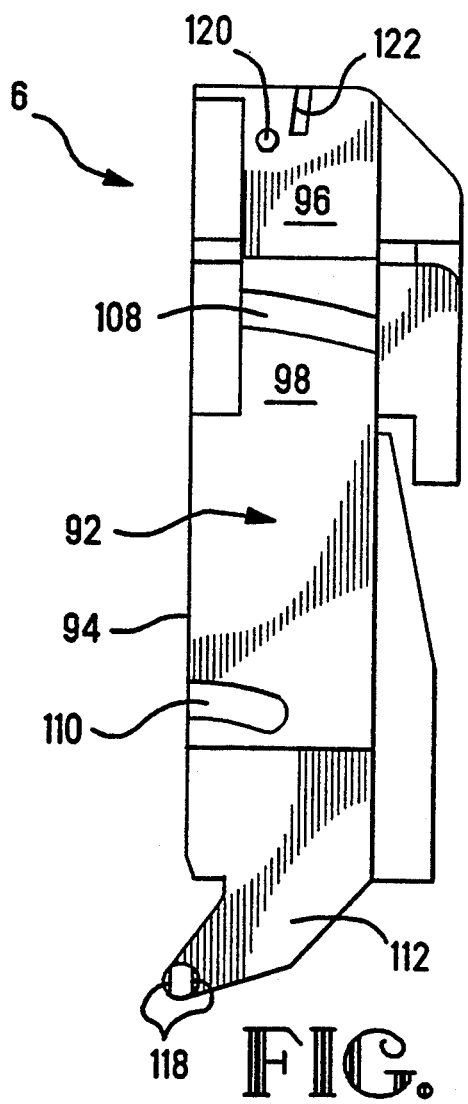
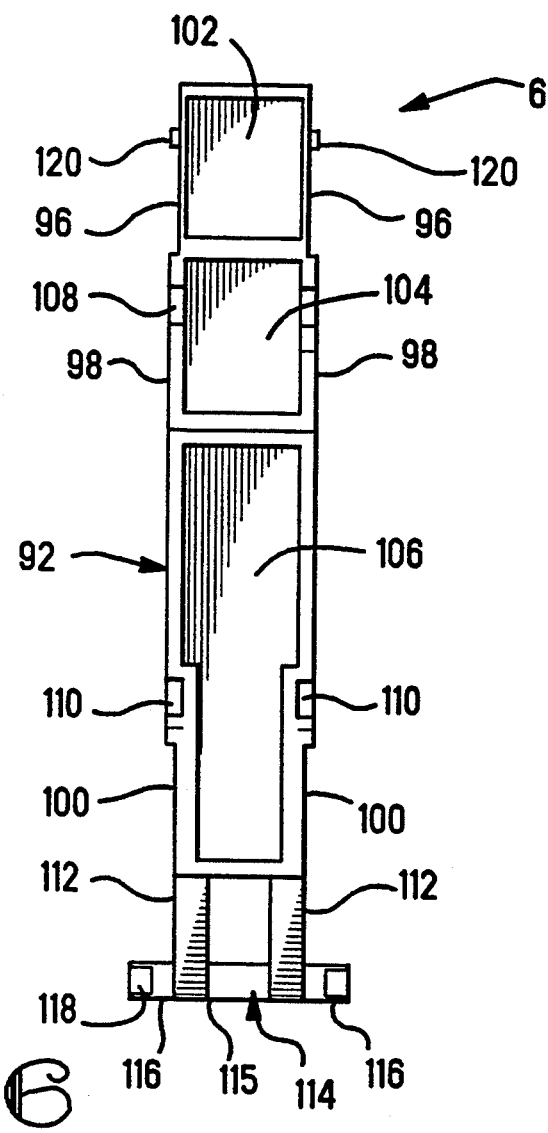
FIG. 5
FIG. 6

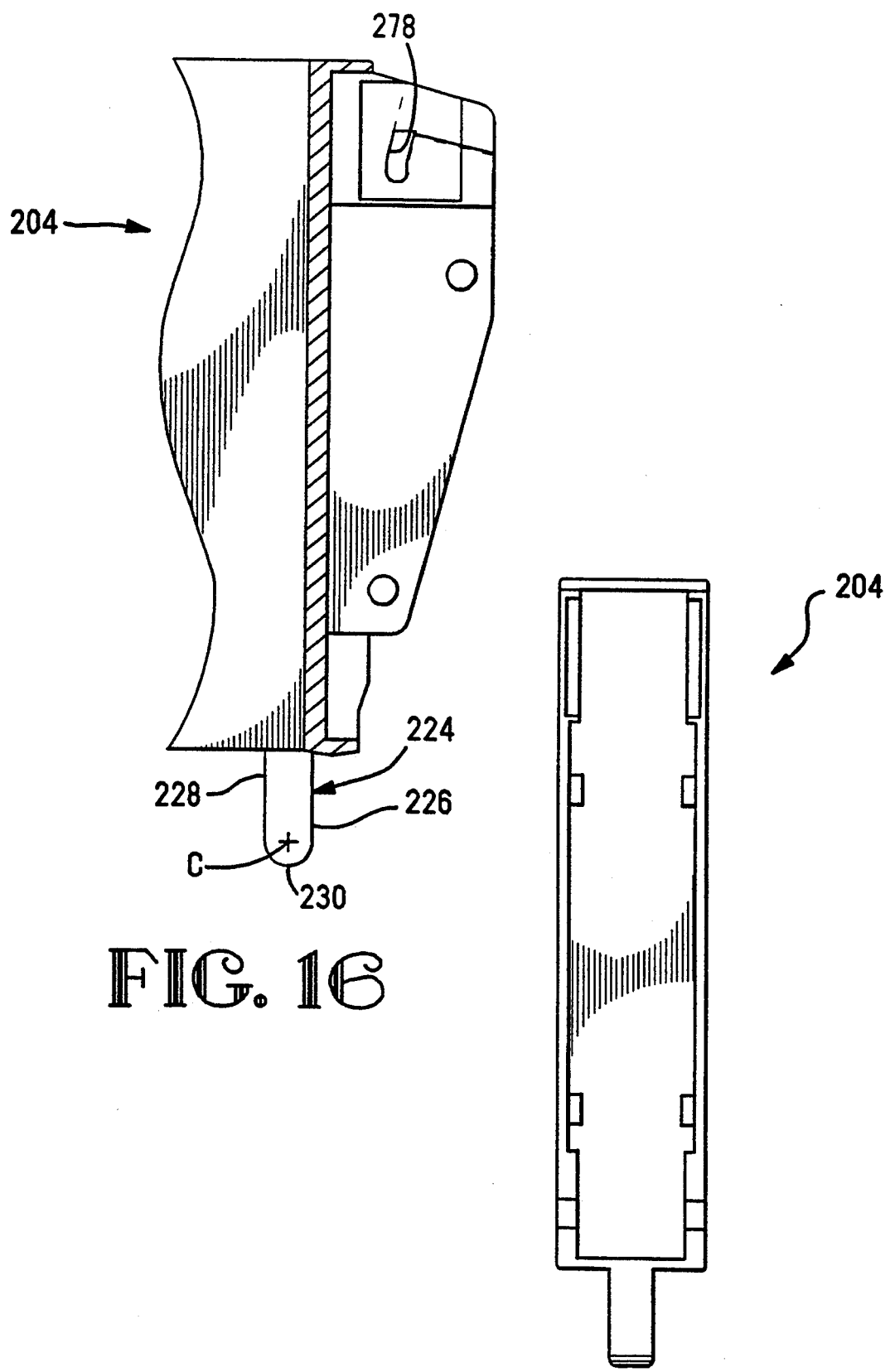

ELECTRONIC CONTROL MODULE ASSEMBLY WITH PIVOTABLE CONNECTOR

BACKGROUND OF THE INVENTION

1. Field of the Invention

The subject invention relates to a control module assembly for use with a plurality of control modules, where the individual control modules are receivable into the assembly, for electronically controlling various electronic aspects of equipment.

2. Description of the Prior Art

The invention is particularly useful in automotive applications where electronic modules control various aspects of the automotive functions, whether fuel-air ratio, various engine controls, and the like. The present designs have several shortcomings which are addressed by the present application.

The present assembly generally includes a lower housing, typically of plastic, having an upper face which receives a plurality of electrical connectors, each connector having mating contacts facing outwardly of said upper face. Another housing is positioned on top of the lower housing, where this upper housing contains a plurality of slots for receiving the modules. Each module is self contained in a metal casing, and includes one or more printed circuit boards within the casing connected to tab terminals. These modules are inserted from a top of the second box, into the slots, and are pushed downwardly such that the tab terminals are placed into registration with an associated electrical connector.

One of the problems with the aforementioned design is that the interconnection between the module and the electrical header connector is a so-called blind mate connection. This is due to the fact that the connectors are disposed at the bottom of the lower plastic housing, and the upper housing is placed on top of the lower housing. Thus, when the modules are inserted into the slots, the mating connector is no longer visible to determine whether the connection is being made properly. A misaligned module could damage either the module or the corresponding connector.

Furthermore, due to the alignment mechanism, the modules are likely to be misaligned with the electrical connectors. As mentioned above, the connectors are aligned with reference to a large high tolerance lower plastic housing. A metallic, generally cast aluminum, upper housing is placed on top of the lower housing, and the modules are subsequently aligned with the upper housing, which too, could contain high tolerance allowances. Due to the tolerance buildup between the connectors and the lower housing, the upper housing and the lower housing, and the module and the upper housing, the modules have a great chance of misalignment with the electrical connectors.

Furthermore, due to the number of tabs extending out of the modules, generally numbering between 30 and 60, the force to insert the module into its final position is extremely high. This requires a special tool to be mounted on the side of the upper housing, which can apply a downward force on the module, in case of insertion, and an upward pulling force in the case of extraction. This special tool is therefore required by, not only the initial assembly installer at the factory, but also, by each service facility which intends to remove, and subsequently reinstall, the modules during servicing. It too, should be appreciated that there is a great risk involved in damaging either the connectors or the modules by this process, in the event that the connector and module are not properly aligned. That is to say that, when using the tool to insert the modules, it is difficult to sense whether the connector or module is being damaged, as it merely drives the module downwardly into place.

Furthermore, the present design is not optimum for heat dissipation. As the connectors sit side by side on the plastic housing, and as the heat comes upwardly from below the connectors, it is difficult for the heat to dissipate past the connectors. More particularly, the connectors are wider than their complementary module, and therefore the connectors sit side-by-side in the plastic housing, in an abutting manner. The heat emanating from below the connectors is difficult to dissipate past the connectors due to the blockage of the upper face by the connectors. This heat dissipation is so important, that the present design includes separate blowers to exhaust the heat buildup, further adding to the complexity and cost of the assembly.

SUMMARY OF THE INVENTION

It is an object of the invention to provide an electrical assembly where the connection between the connector and the modules, are not blindly mated.

It is an object of the invention to prevent the buildup of tolerance mismatch, thereby providing for proper alignment between the electronic modules and the mating connectors.

It is a further object of the invention to provide an electrical assembly where the module and connector can be fully mated without the necessity of a special tool.

It is a further object of the invention to provide an electrical assembly which is designed for better heat dissipation, eliminating the requirement for special cooling devices.

The objects of the invention have been accomplished by providing electronic control assembly comprised of a control box capable of housing at least one control module where the module has electrical elements electrically connectable with connection means of a mateable electrical connector positioned in the box. The assembly is characterized in that the control module is slidably receivable into the control box into juxtaposition relative to the electrical connector where the electrical connector is pivotably moveable relative to the control module to make electrical engagement between the electrical elements and the connection means.

By providing pivotal movement between the connector member and the electronic module, the overall insertion force has been lowered by providing a step-wise insertion force of the mating electrical elements. More particularly the mating electrical elements closest to the pivotal end of the connector are first engaged followed by subsequent electrical elements radially distanced from said pivotal end as said connector member is pivoted.

In the preferred embodiment of the invention, the connector member includes a locking lever positioned directly on the electrical connector which, together with the lowered insertion force has eliminated the requirement of the specialized tool which is mounted to the upper housing of the prior art embodiments.

In another aspect of the invention an electronic control assembly comprises a control box capable of housing at least one control module, where the module has electrical elements electrically connectable with connection means of a mateable electrical connector positioned in the box. The assembly is characterized in that the control module is slidably receivable into the control box, with the electronic module and the electrical connector having a cooperable registration means provided thereon, whereby the alignment between the electronic module and the electrical connector is defined by the cooperating registration means. The connector member is movable between a first open position to a second electrically connected position with said module, the connector member being moveable relative to the registration means to provide positionally correct alignment between the module and the electrical connector.

By providing registration means cooperable between the electrical connector and the electronic module, the tolerance built up between the housings has been eliminated in that the electronic module is aligned by the cooperating registration means, and the connector can thereafter be brought into electrical engagement with the module.

BRIEF DESCRIPTION OF THE DRAWINGS

FIG. 5 is a side view of the electrical connector shown in FIG. 1;

FIG. 6 is a plan view of the front mating face of the electrical connector shown in FIG. 5;

FIGS. 14-17 are similar to FIGS. 3-6, respectively, showing an alternate embodiment;

DETAILED DESCRIPTION OF THE PREFERRED EMBODIMENT

Figure 1:
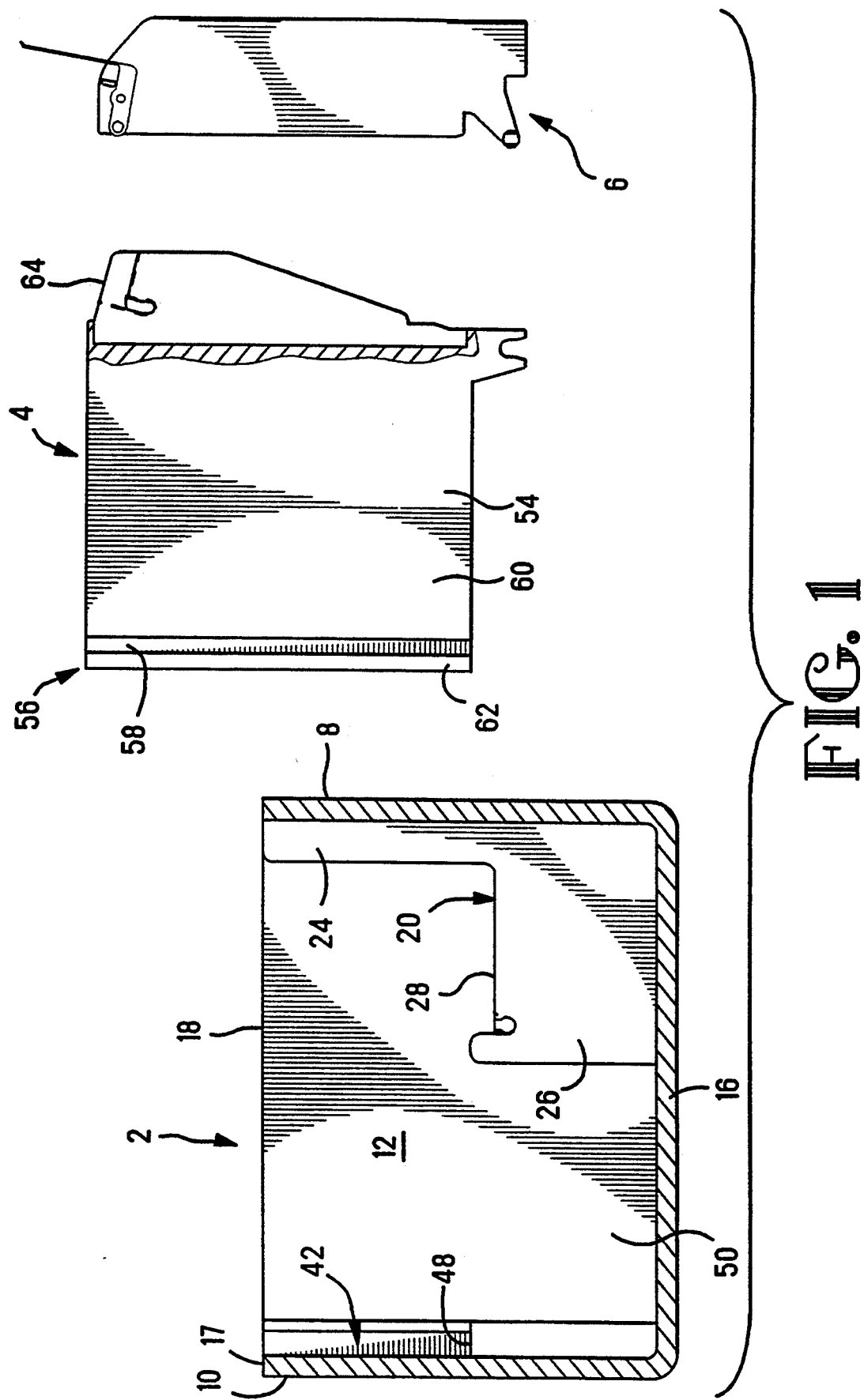
FIG. 1 is a view of the connector and electronic module exploded away from the lower control box.

With reference first to FIG. 1, the subject invention relates to an assembly comprised of a control module box shown generally at 2 which can receive an electronic module 4 and an electrical connector 6. The electrical connector is cooperable with the box 2 for alignment therewith, such that the connector 6 is rotatable relative to the box 2, and the control module 4 is cooperable with the box 2 and the electrical connector 6 to precisely position the electronic module and electrical connector 6 in precise juxtaposition for electrical connection between the module and the electrical connector 6.

Figure 2:
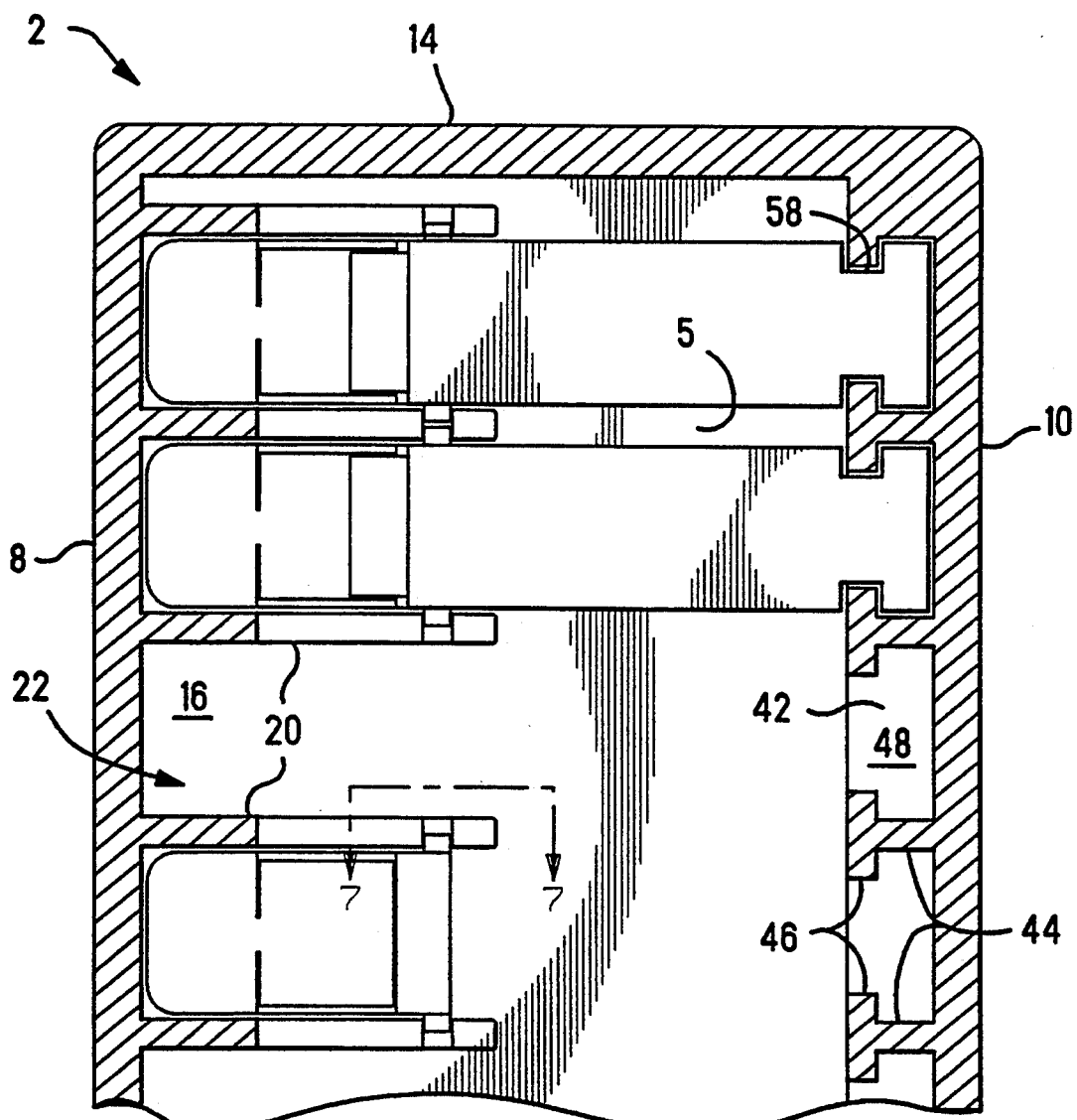
FIG. 2 is a cross sectional view of the lower control box showing the separate compartments for receiving the connector and the control module.
Figure 7:
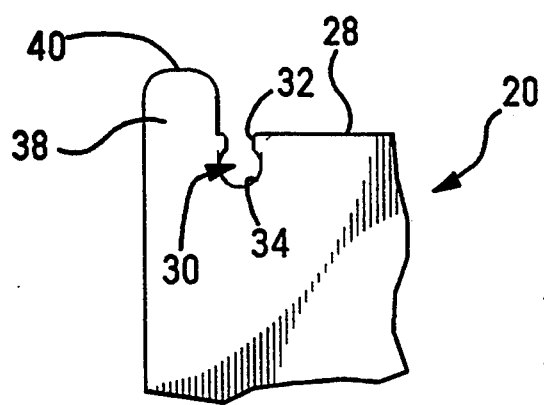
FIG. 7 is an enlarged view of the control box sidewall as viewed along the lines 7—7 in FIG. 2.

With reference now to FIGS. 1 and 2, the control box 2 will be described in greater detail. The control box 2 includes side walls 8 and 10 and end walls 12 and 14. The box 2 also comprises a lower floor section 16 and an opposing open upper mating face 18. As shown in FIG. 1, the box contains a plurality of L-shaped walls such as 20 to define module-receiving compartments 22, as shown in FIG. 2. Each of the L-shaped walls 20 is comprised of a vertical upstanding portion 24 which extends upwardly to the open upper face 18 and includes a lower wall portion 26 providing an upper support surface 28. As shown in FIG. 7, each of the support walls 28 carries a trunnion 30 having a pair of spaced apart vertical walls 32 forming flat entry surfaces forming a keyed entry leading into a cylindrical through bore 34. Each wall 20 further includes a support lug 38 having an upper support surface 40.

On the opposite side of the housing 2, adjacent to the side wall 10 are T-shaped slots 42 defined between spaced apart side walls 44 and inner end walls 46, as shown in FIG. 2. The box 2 also includes at the bottom of the T-shaped slot 42 a support surface 48 as shown in both FIGS. 1 and 2, which will be described in greater detail herein. It should also be noted from FIGS. 1 and 2 that the spacing 22 between each adjacent side wall 20 communicates with an enlarged opening 50 which is transverse to the spaced apart walls 20. This transverse space is shown generally at 50 in FIG. 1 and is provided for the lacing of the multitude of insulated cables which must be interconnected to the various connectors 6 spaced along in the control box 2.

Figure 3:
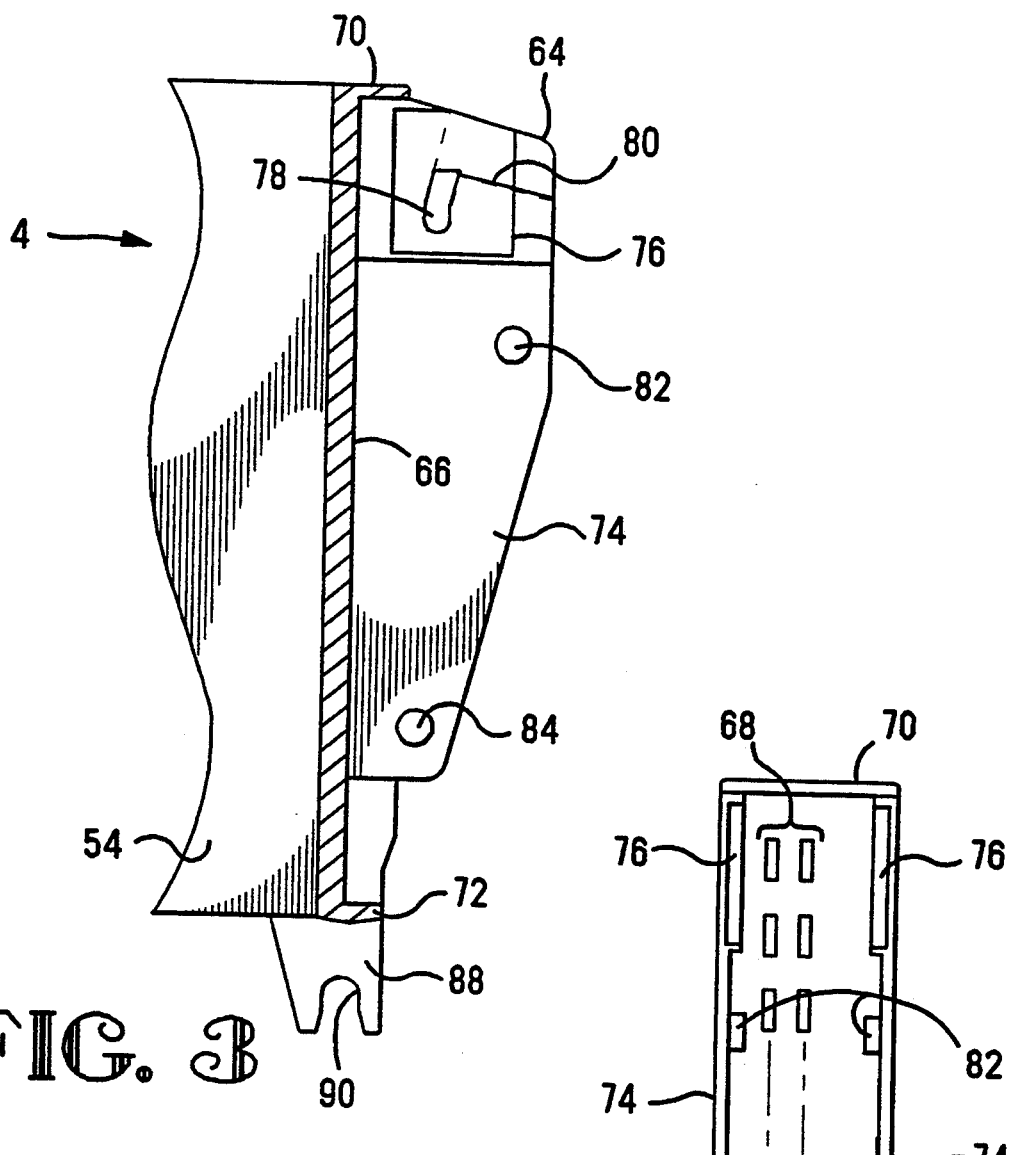
FIG. 3 is a view of the electronic control module in partial cross section.
Figure 4:
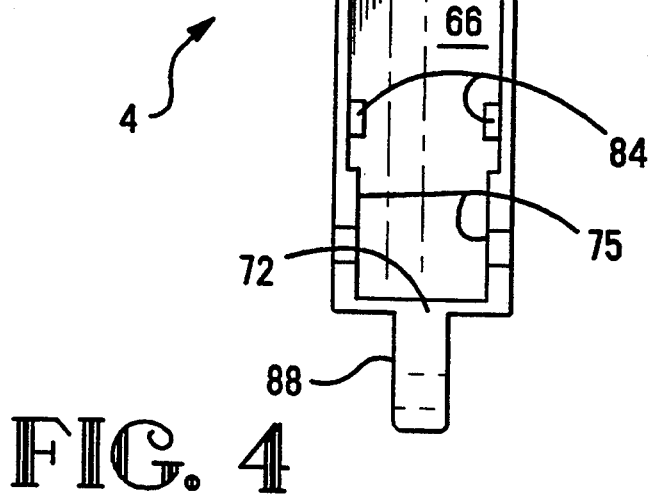
FIG. 4 is a view looking at the front face of the electronic control module shown in FIG. 3.

With reference now to FIGS. 1, 3 and 4, the electronic module 4 will be described in greater detail. As shown first in FIG. 1, the module 4 includes an enclosure shown generally at 54 which could comprise any suitable protective covering such as a metal casing, or a plastic outer housing. Rearwardly of the control module 4 is a T-shaped alignment member shown generally at 56 (FIG. 1) defined by a vertical groove 58 recessed from the side surfaces 60 and 62 of the enclosure 54, as best shown in FIG. 2. As shown in FIG. 1, the module 4 further includes a connector member 64 which is generally fixedly connected to the enclosure portion 54 and is electrically connected to circuitry within the enclosure 54, the circuitry usually being mounted on such devices as printed circuit boards or printed circuit cards.

The connector member 64 is shown in partial cross section in FIG. 3 as including a rear wall portion 66 which, as shown in FIG. 4, includes a plurality of pin or tab terminals 68 projecting therethrough for electrical interconnection to the printed circuit boards within the enclosure 54. The connector member 64 further comprises end walls 70 and 72 and opposing side walls 74. Each of the side walls 74 includes a molded insert 76, preferably of a rigid material such as a hardened plastic or metal, providing a latching groove 78 and a lead in surface shown at 80. The side walls 74 also carry alignment lugs 82 and 84 for precise alignment of the electronic module 4 with the connector member 6. As shown in FIG. 3, the connector member 64 further comprises at a lower end thereof an alignment leg 88 medially positioned with respect to the connector as shown in FIG. 4, and includes a U-shaped alignment opening 90, or yoke, as will be described in greater detail herein.

With respect now to FIGS. 5 and 6, the connector 6 will be described in greater detail. The connector 6 comprises a connector housing 92 having a front mating face 94, where the connector 6 and module 4 are cooperable such that the face 94 can be abutted against the inner face 66 of the module 4. As shown in FIG. 6, the housing 92 is profiled with recessed surfaces 96 for clearance between the inserts 76 (FIG. 4). The housing 92 further comprises outer side surfaces 98 profiled to be received between the side walls 74 of the module 4 and side surfaces 100 profiled to fit between the inner surfaces 75 of the module 4. The housing 92 also includes inserts 102, 104 and 106 profiled to be received in the housing 92 for receiving a plurality of electrical terminals which are interconnectable to the tabs or pins shown at 68 in FIG. 4.

As shown in FIGS. 5 and 6, the outer side surfaces 98 further include arcuately shaped aligning grooves 108 and 110 profiled for engagement with the lugs 82 and 84 respectively carried on the inner surface of the side wall 74, shown in FIG. 4, for positionally correct alignment between the contacts of the connector with the tabs 68 of the module assembly 4. As also shown in FIGS. 5 and 6, the connector body 92 includes mounting legs 112 having a generally cylindrical pinion 114 extending between the mounting legs 112 and including portions 116 extending beyond the legs 112. The pinion portions 116 include flat surfaces 118 at each end, which in a preferred embodiment, are parallel with the mounting face 94.

Figure 8:
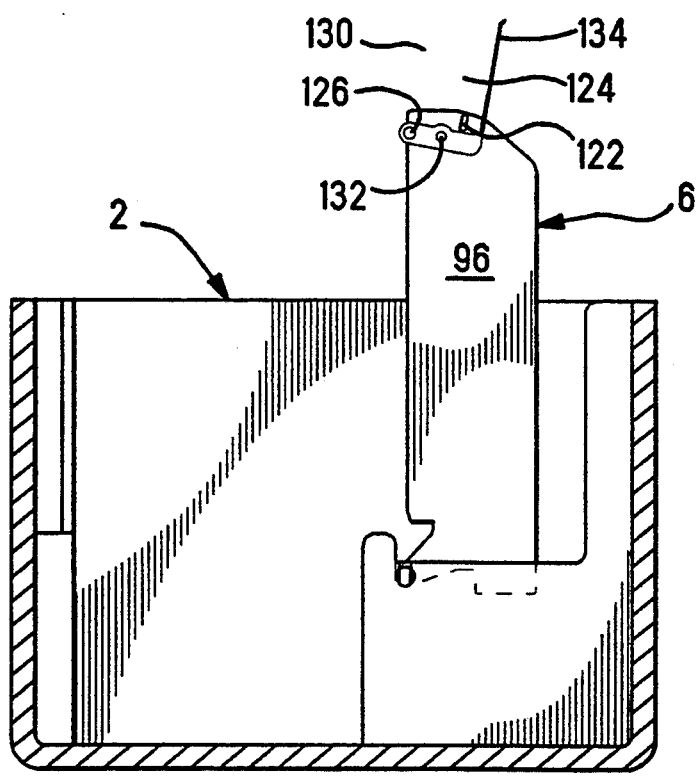
FIG. 8 shows the connector as it is inserted along a vertical axis into position within the control box.

The upper surfaces 96 also carry mounting lugs 120 and a rotational stop member 122 as shown in FIG. 5. As shown in FIG. 8, the mounting lugs 120 retain a pivoting lever 124 to the connector body 92 where the lever is retained in a fully open position as shown in FIG. 8 by way of the stop member 122. It should be appreciated that the locking lever is somewhat U-shaped in nature having parallel arms 130 which straddle the outside surfaces 96 of the connector where each arm 130 includes an aperture 132 overlying the locking lug 120 (FIG. 5) to retain the locking lever in place. The locking lever 124 also includes an actuating portion 134 which interconnects the two parallel arms 130 and can be grasped to actuate the lever between its opened and closed positions.

Figure 9:
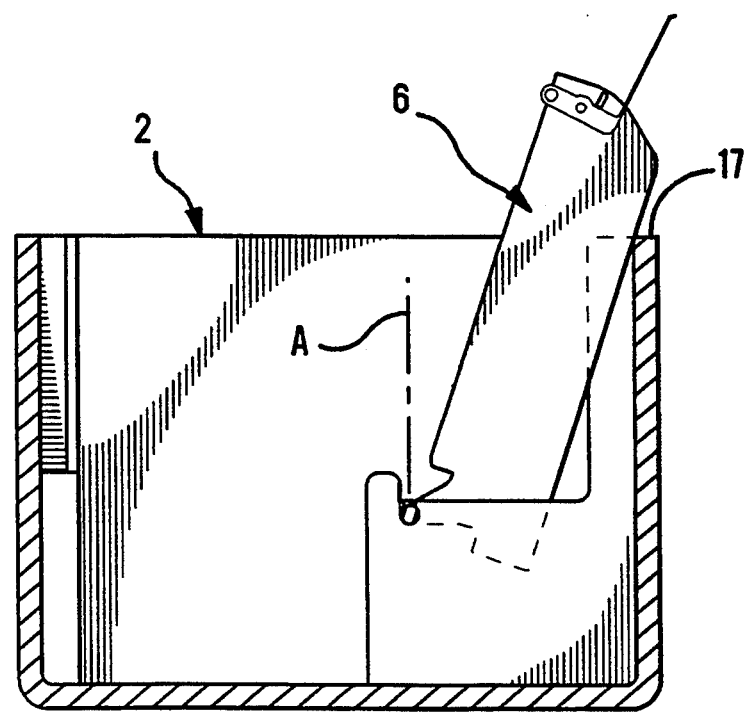
FIG. 9 shows the connector rotated to a fully open position, whereupon the module may be inserted.

As shown in FIG. 8, the connector member 6 is installed in the control box 2 by moving the connectors vertically downwardly such that the flats 118 (FIGS. 5 and 6) are positioned between the parallel and opposed surfaces 32 (FIG. 7) which positions the pinion members 116 in respective mounting trunnions 30, straddled between two of the adjacent side walls 20. Due to the flats 118, once the connector is pivoted clockwise or counter clockwise relative to its insertion position shown in FIG. 8, the connector is locked in place within the cylindrical portion 34. Each of the connectors 6 can thereafter be pivoted to the position shown in FIG. 9, where the connector 6 abuts the rim 17 of the control box 2. It should be appreciated in this position, that the pinion portion 115 (FIG. 6) is accessible along the axis A, as shown in FIG. 9.

Figure 10:
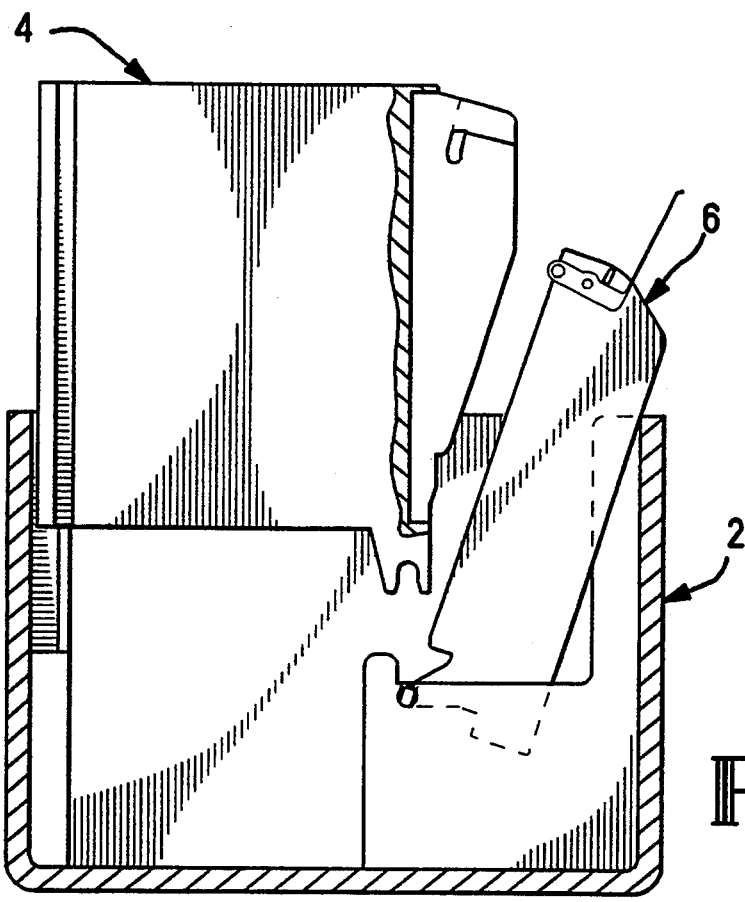
FIG. 10 shows the insertion of the control module into the control box.

As shown in FIG. 10, the electronic module 4 can now be inserted from the vertical position above the control box and can be aligned with the T-shaped member 56 positioned in the T-shaped slot 42 (FIG. 2) and brought into registration with the connector as shown in FIG. 10. It should be appreciated that as the alignment leg 88 is centrally positioned relative to the electronic module, as shown in FIG. 4, that the module is positioned with the U-shaped slot 90 (FIG. 3) overlying the central pinion portion 115 (FIG. 6) of the pinion 114 of the connector. Meanwhile the connector 6 is held in pivotal position within the control box 2 by way of the outer lugs 116 held in position within the trunnions 30 of the control box 2.

Figure 11:
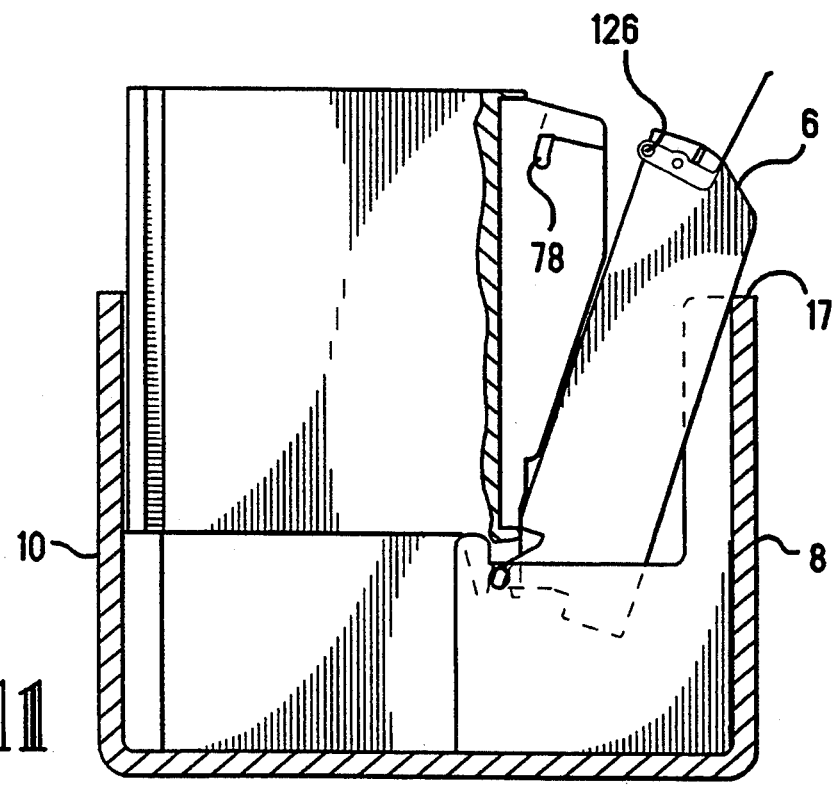
FIGS. 11 and 12 show the pivotal movement of the connector towards the control module, and the movement of the latching lever to lock the connector to the module.

Thus, the electronic module 4 is positioned relative to the connector rather than having the module individually and the connector being positioned relative to the control box. This allows precise alignment between the mating contact portions of the electronic module and the connector member 6. As shown in FIG. 11, when a control unit is fully positioned in the control box, such that the U-shaped member is fully engaged with the center pinion portion 115, the lower portion of the control unit is engagement with the shoulder 48 (FIG. 1) which assists the vertical correct positioning.

Figure 12:
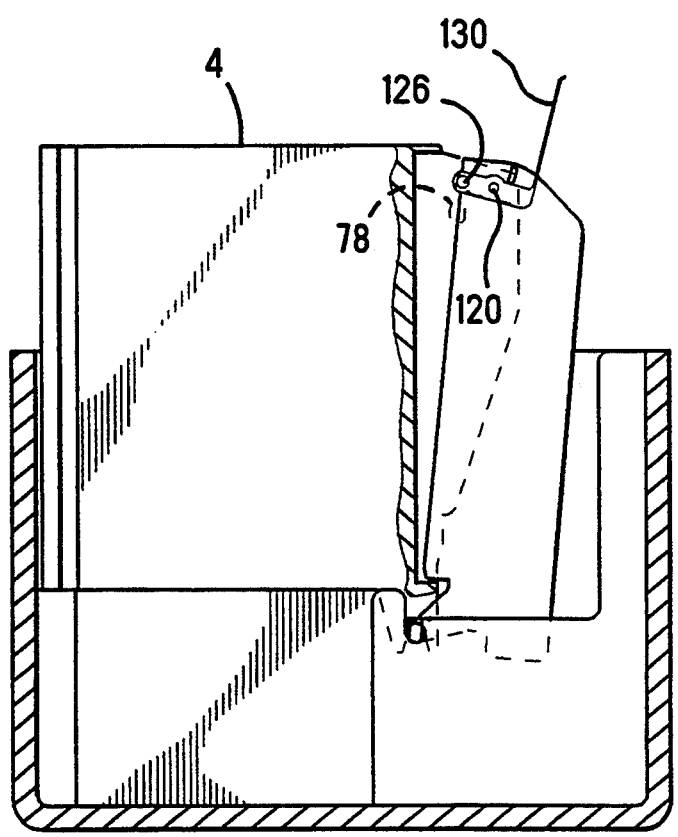

The connector 6 can now be pivoted from the position shown in FIG. 11 where the connector abuts the control box rim 17 to a position where the locking lug 126 is in alignment with the arcuate groove 78 as shown in FIG. 12. The lever portion 130 can now be pivoted about the lug 120 which positions the locking lugs 126 in the arcuate grooves 78 and pivotal movement of the lever causes the lug 126 to travel down the arcuate path to a bottom position in the groove 78. When the locking lug 126 reaches the bottom of the arcuate grooves 78, continued pivotal motion of the locking lever 130 causes the movement of the connector body towards the electronic module 4 until it is in a fully locked position as shown in FIG. 13.

Figure 13:
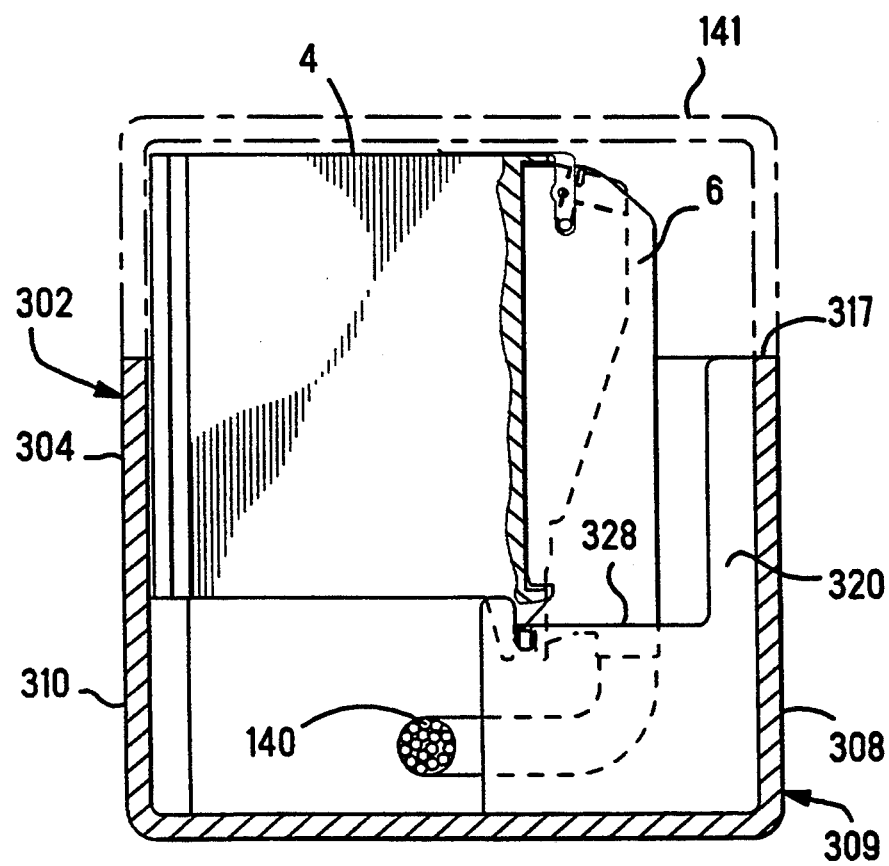
FIG. 13 shows the connector fully locked to the electronic module.

As also shown in FIG. 13, the connector 6 is shown interconnected to a multi-conductor cable 140 which can be initially positioned within one of the channels 22 below the associated connector 26, and can thereafter be positioned in the channel 50 to move in a direction transverse to the corresponding channels 22. It should be appreciated that a suitable opening should be provided in the control box to provide an exit for the plurality of individual insulated cables such as 140. It should be noticed from FIGS. 10 and 13, that the upper rim 17 of the control box is lower than the highest position of the electronic control module. This allows greater accessibility of the individual control modules by grasping the control module with the users hand, in that the user is not hampered by the confines of the walls of the control box. Furthermore, lowering the upper surface 17 to a position below the top of the control module, allows for maximum pivotability, while yet maintaining the structural integrity of the box, and keeps the control box to a minimum width. Said differently, if the upper rim 17 were higher than that shown in FIG. 11, the width of the box, that is, the spacing between the walls 8 and 10 shown in FIG. 13 would have to be greater to allow the connector to pivot to the same rotational position. Most likely, a cover, such as that shown in phantom in FIG. 13, as 141, would be placed over the control box 2, to cover the electronic control modules and connectors 6.

Figure 14:
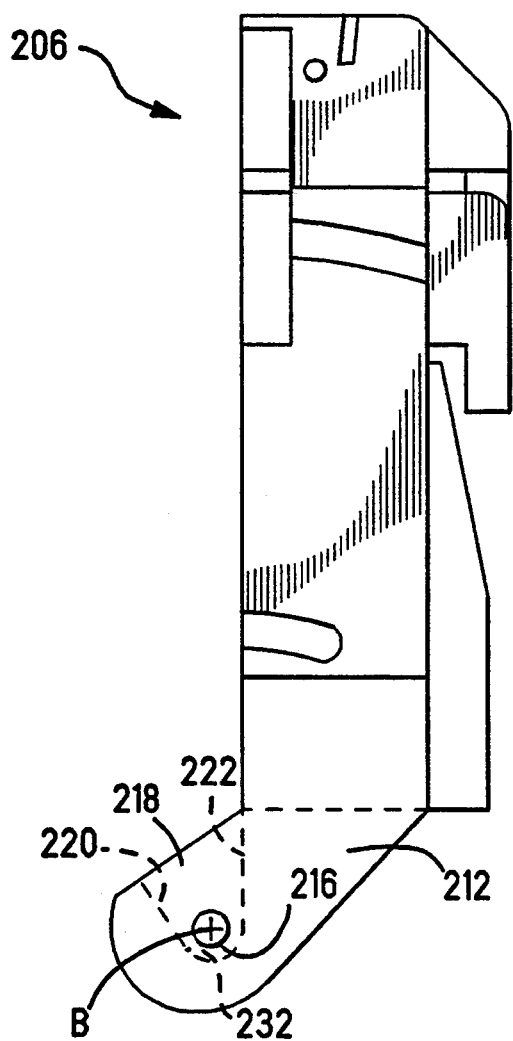
Figure 15:
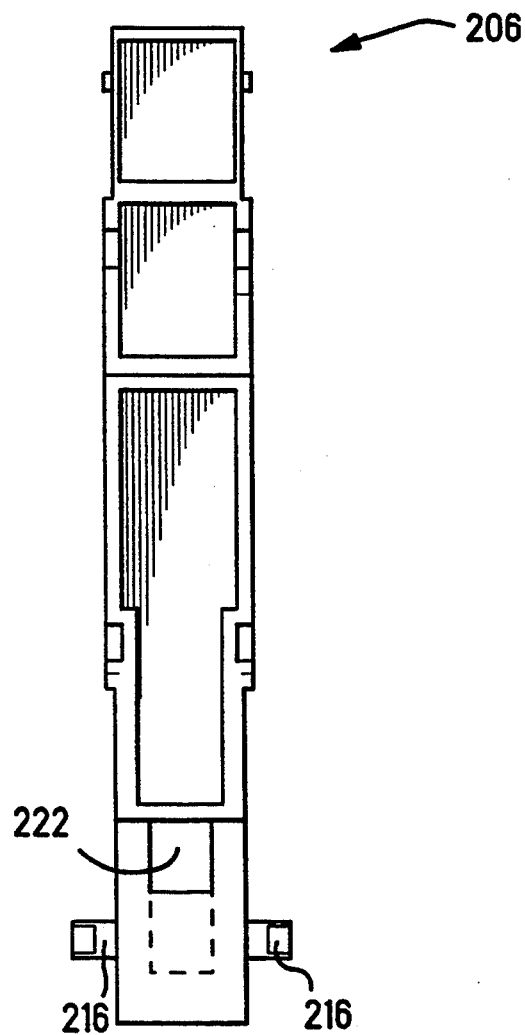

As shown now in FIGS. 14–17, alternate embodiments of the connector and module are shown. As shown in FIGS. 14 and 15, an alternate connector is shown at 206 which is similar in nature to the connector 6, except for the locating mechanism between the connector and the module. As shown in FIG. 14, the connector 206 includes a trunnion portion 212 having outer lug portions 216 and an inner trunnion 218 having extreme stop surfaces 220 and 222.

As shown in FIGS. 16 and 17, the module is shown as 204 and is similar as that explained above with respect to 4, except for the lower pivot portion. The module 204 would have at the lower end of the module, a pivot leg 224, which would have side surfaces 226 and 228. It should be appreciated that the leg 224 is insertable into the trunnion portion 218, similar in nature to the first embodiment. As inserted, a lower surface 230 of the leg 224 abuts an inner surface 232 in the trunnion 218, and is rotatable between positions where the side surface 226 abuts the surface 222, and where side surface 228 abuts the surface 220. It should also be noted that the pivot axis B of the connector 206 is coincident with the axis C, about which the connector 206 pivots with respect to the module 204.

Figure 18:
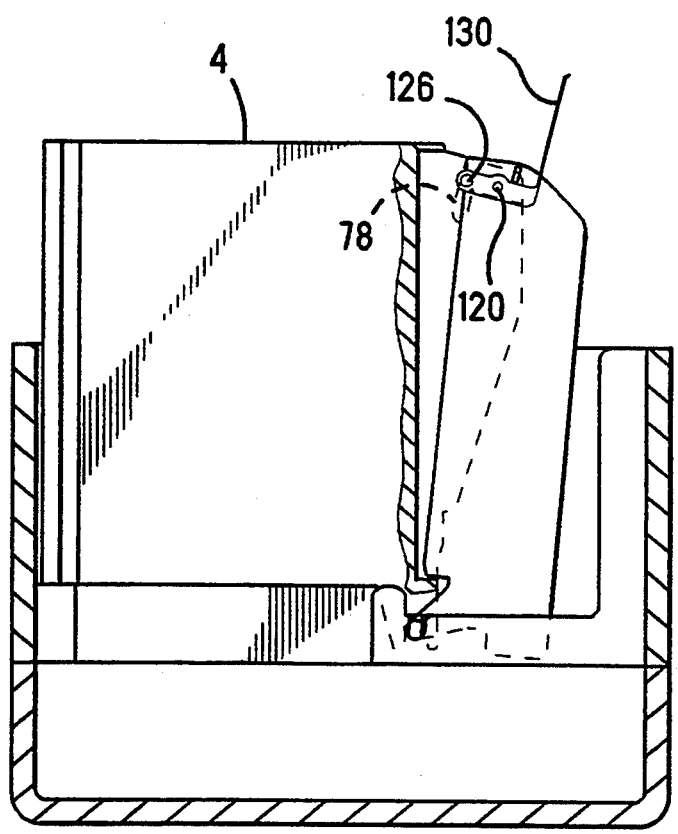
FIGS. 18 and 19 is a further alternate embodiment, similar to the embodiment of FIGS. 1-13, showing a control assembly having a three part control box.
Figure 19:
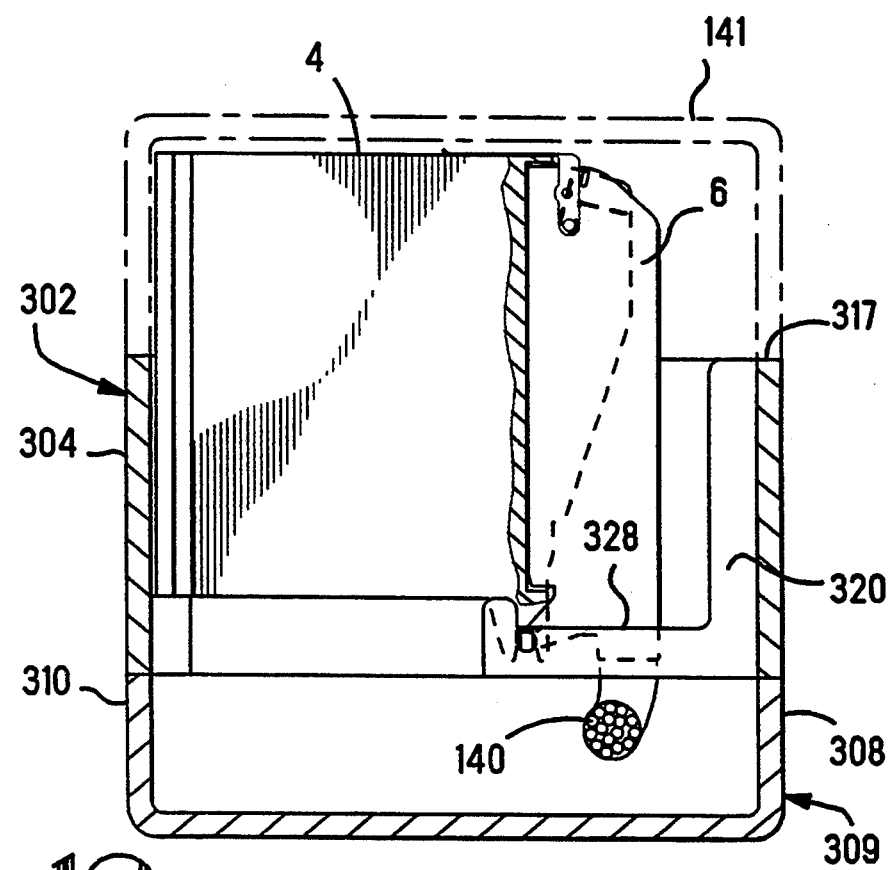

With reference now to FIGS. 18 and 19, a further embodiment is shown where the control box 302 is similar to the control box 2 above, but is comprised of three parts: an upper cover part 141, an intermediate part 304 and a lower part 309. The box is configured to receive the identical module 4, but by having the box slit into three parts, more space is available for the cables. As shown in FIG. 19, the walls 320 spanning the connectors do not extend below the bottom of the intermediate box 304, thereby allowing the entire volume of the box portion 309 for the cables 140. The walls 320 are similar in nature to the above embodiment, the walls having an upper surface 328 which carries a trunnion similar to the trunnion shown in FIG. 7.

Figure 20:
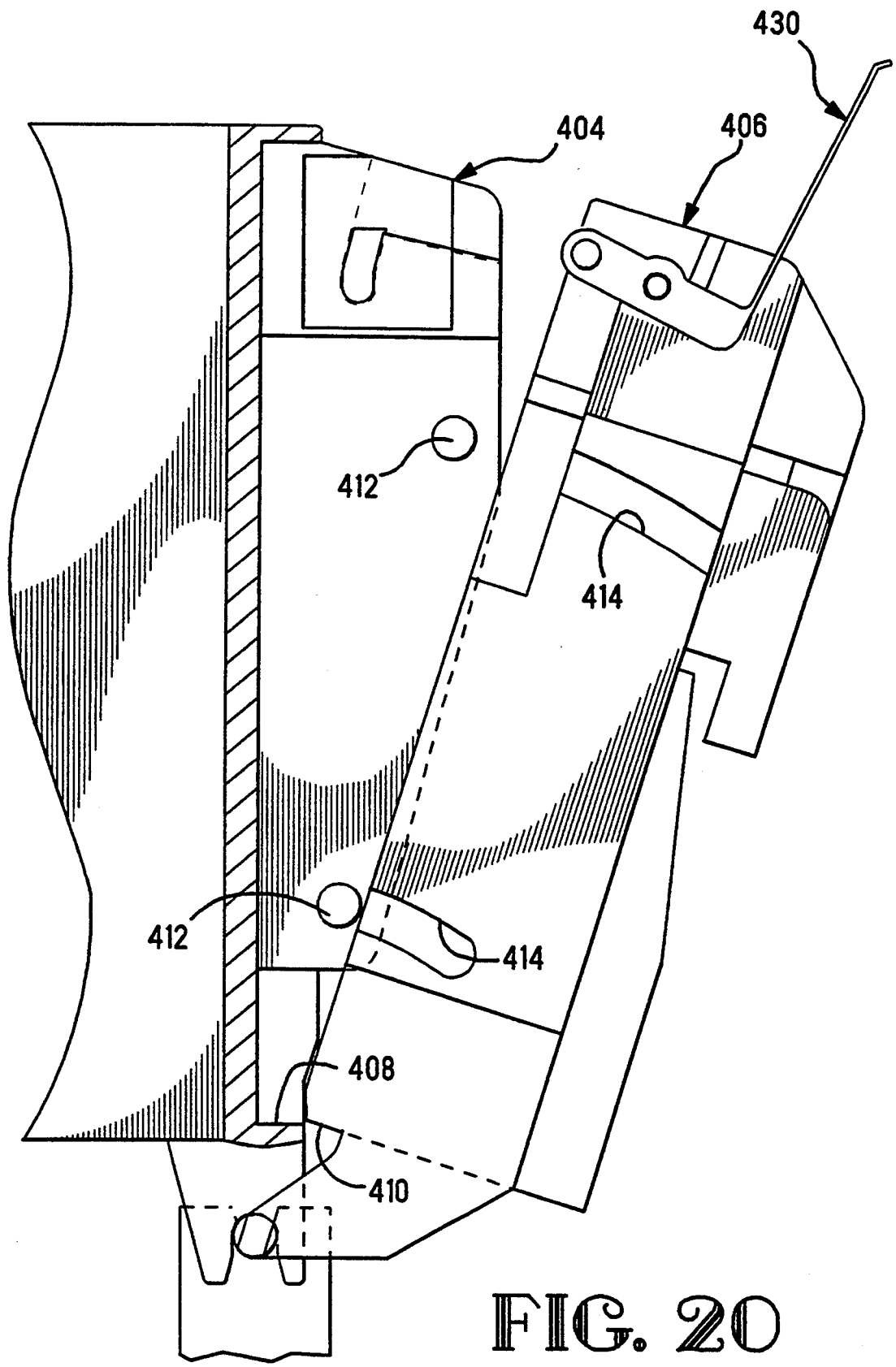
FIG. 20 is yet another alternate embodiment of a control assembly similar to the embodiment of FIGS. 1-13.

A further embodiment is shown in FIG. 20 comprised of a control module 404 and a connector 406. In this embodiment, the module 404 is positioned in the box by way of a slot 42, where the module rests on a lower shoulder 48 (See FIG. 1) in the control box. The alignment between the connector 406 and the module 404 is made between the camming shoulder 408 on the module, and the camming surface 410 on the connector. As the connector is rotated into the module, a camming cooperation between the members 408 and 410 vertically aligns the connector with the module. In this embodiment, the connector 406 has some vertical play, such that the connector can be vertically raised for alignment with the module. When the connector is rotated such that the lugs 412 are positioned in their associated grooves 414, these members 412,414 provide the final alignment between the connector and the module.

Figure 21:
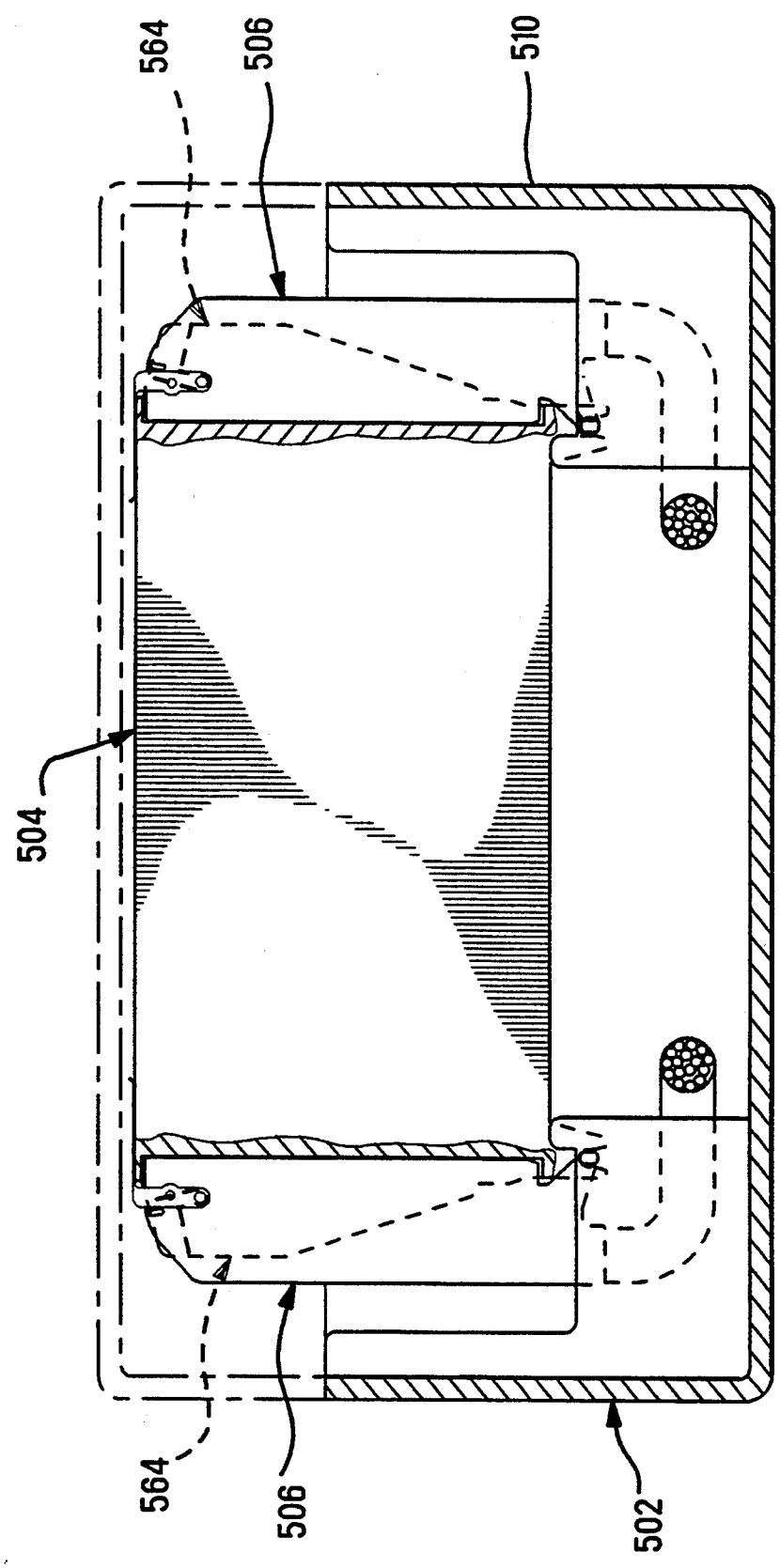
FIG. 21 shows a further embodiment where the electronic module can accommodate a connector member at each end thereof.

Finally, by positioning the module in the control box sideways, the electronic assembly can take on the configuration shown in FIG. 21, where the electronic module 504 has a connector element 564 at each end thereof, and where the assembly has two rotatably mounted connectors 506 which can be rotated into the connector members 564. This allows the modules to have a high density of electrical connections, while at the same time, minimize the density of electrical connections at one end face.

Figure 22:
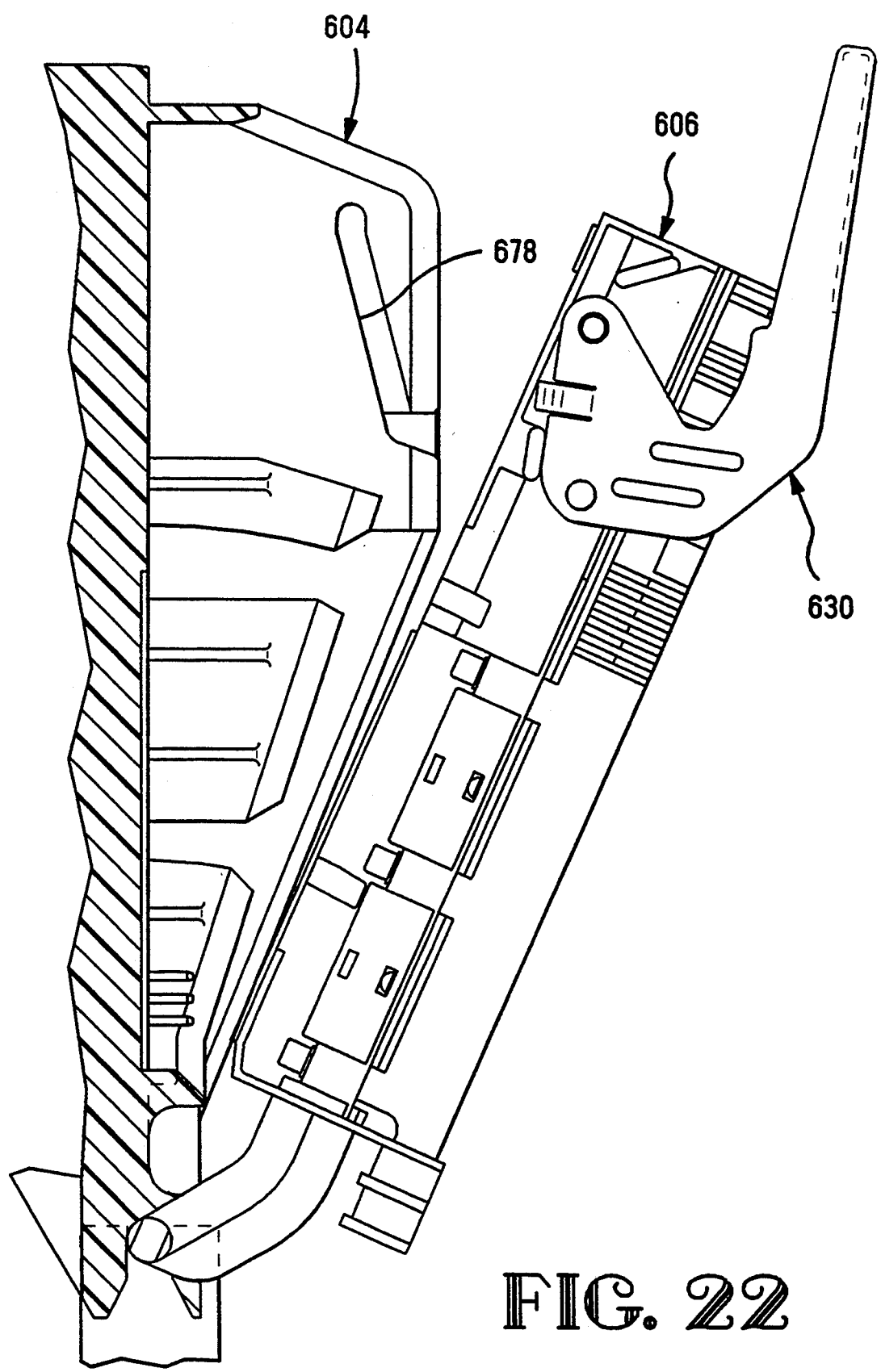
FIG. 22 shows a further alternate embodiment.

Another embodiment of the assembly is shown in FIG. 22, having a differently configured locking assembly, such as locking lever 630 on connector member 606, which is cooperable with slot 678 on the module 604.

It should be appreciated then, that the above embodiments have overcome the shortcomings of the previous electronic control modules. First, by pivotally aligning the connector with the control module, the assembly provides for pivotally correct alignment of the electrical connection members of the connectors and modules. This alignment can be accomplished by making the axis about which the connectors pivot with respect to the control box, coincident with the axis which the connector pivots with respect to the electronic module. This alignment can also be made by providing cooperating camming surfaces on the module and the connector, to provide for correct alignment thereof. Moreover, as the connectors are pivotally mounted in the control box from a lower end thereof, the module is insertable into the control box with the tabs of the module adjacent to the connection elements of the connector, and these connection elements and tabs can be viewed from above due to the pivot angle of the connectors.

Furthermore, due to the pivoting motion of the connector relative to the module, the mating of the tabs in the control module with the connection elements in the connector does not happen simultaneously. Rather, the pivot end of the connector begins mating first, followed by a step-wise succession of mating contacts leading to a lower maximum insertion force. As the insertion force is reduced, a locking lever can be integrated with each connector, to move the connector into place with the module, thereby eliminating special tools to be mounted to the control box.

Also, by mounting the control modules with their tabs facing sideways, the lateral distance between the adjacent electronic modules can be increased, and includes a spacing 5 between adjacent modules 4, as shown in FIG. 2. This allows the heat to dissipate from below the modules, up between the modules, without the requirement for cooling. Furthermore, by placing the modules with the tabs facing sideways, the modules can be provided with a connector member at each end thereof, as shown in the embodiment of FIG. 21.

We claim:

1. An electronic control assembly comprised of a control box, at least one control module receivable in said control box and a mateable electrical connector positionable in said box, said module having electrical elements electrically connectable with connection elements of said mateable electrical connector, said assembly being characterized in that said control module is slidably receivable into said control box into juxtaposition relative to said electrical connector, said electrical connector being movable relative to said module by the provision of locator members cooperably provided on said connector and said module, to define an insertion position of said control module into said control box, and to locate said electrical elements of said control module to said connection elements of said electrical connector, for proper alignment upon said movement.

2. The assembly of claim 1, characterized in that said electrical connector is pivotally movable into electrical engagement with said control module.

3. The assembly of claim 2, characterized in that said located members includes a pivot arm extending from one end of said electrical connector having a stop surface which is engagable with an engaging surface on said control module.

4. The assembly of claim 3, characterized in that said stop surface is provided by at least one pinion, and said engaging surface is provided by a yoke on said control module engagable with said at least one pinion.

5. The assembly of claim 3, characterized in that said pivot arm includes at an end thereof, a cupped section facing said insertion direction of said control module, and profiled to receive a stop lug at the leading end of said control module.

6. The assembly of claim 3 characterized in that said pivot arm includes lugs centered along said pivot axis, which are positioned in a trunnion located in said control box, and pivotally mounted therein.

7. The assembly of claim 6, characterized in that said control box includes at least one control module receiving slot defined by end walls and side walls, where said trunnion is located in the side walls and accessible from a vertical position above.

8. The assembly of claim 10, characterized in that said electrical connector is pivotal between a position where a front mating face of said electrical connector is vertical, to a position where said electrical connector rests against said end wall.

9. The assembly of claim 8, characterized in that said control box has an open upper face for receiving said control module, where said electrical elements of said module face said one end wall.

10. The assembly of claim 1 characterized in that said electrical connector pivots about said box along the same axis at which the electrical connector pivots relative to said module.

11. The assembly of claim 1, characterized in that said control box has an upper edge positioned below the top of said control modules.

12. The assembly of claim 1, characterized in that said assembly includes a locking lever located on either said control module or said electrical connector, cooperable with a locking member on the opposite said member as said locking lever, for drawing said module and electrical connector together.

13. The assembly of claim 1, characterized in that said control box includes upstanding spaced apart support walls, said walls carrying trunnions, and said electrical connector member is insertable into said control box and includes a pivot pinion which cooperates with said trunnions to allow pivotal movement between said electrical connector and control box.

14. The assembly of claim 13, characterized in that said connector includes two arms extending from a lower edge thereof, where said pinion includes portions extending from outside surfaces of said arms, and an intermediate portion extending between said arms.

15. The assembly of claim 14, characterized in that said electrical connector is pivotal towards an end wall of the control box, thereby to expose said intermediate pinion portion from an open face of the control box.

16. The assembly of claim 15, characterized in that said module includes an alignment leg having an open yoke which is profiled to be received between the two arms and over the intermediate pinion portion.

17. The assembly of claim 1, characterized in that said module includes spaced apart sidewalls at a front mating face thereof profiled to receive therebetween, the electrical connector, the module sidewalls and electrical connector sidewalls including locating means to provide correct alignment between the module and electrical connector.

18. The assembly of claim 1, characterized in that the control box includes an open face for receiving said modules, and a plurality of module receiving slots, said control box being profiled to receive said modules in said associated slots with said electrical elements facing relatively horizontally, towards a sidewall thereof, and towards said electrical connector, said electrical connector being pivotally movable into electrical engagement with said module.

19. An electronic control assembly comprised of a control box, at least one control module receivable in said control box and a mateable electrical connector positionable in said box, said module having electrical elements electrically connectable with connection elements of said mateable electrical connector, said assembly being characterized in that said control box includes at least one receiving compartment for slidably receiving said control module, said electrical connector being pivotally mounted within said control box with said connection elements facing said compartment, said electrical connector being pivotally movable away from said compartment to a position allowing the slidable receipt of said module into said compartment with said electrical elements facing said electrical connector, and being thereafter pivotally movable towards said module, with said connection elements being moved into electrical engagement with said electrical elements.

20. The assembly of claim 19, characterized in that said electrical connector and said module are pivotal relative to each other by the provision of locator members cooperably provided on said connector and said module to locate said electrical elements of said control module to said connection elements of said electrical connector, for proper mating upon said pivotal movement.

21. The assembly of claim 20 characterized in that said locator members defines the insertion depth of said control module within said control box.

22. The assembly of claim 20, characterized in that said locator members include a pivot arm extending from one end of said connector having a stop surface which is engagable with an engaging surface on said control module.

23. The assembly of claim 22, characterized in that said stop surface is provided by at least one pinion, and said engaging surface is provided by a yoke on said control module engagable with said at least one pinion.

24. The assembly of claim 23, characterized in that said connector includes two arms extending from a lower edge thereof, where said pinion includes portions extending from outside surfaces of said arms, and an intermediate portion extending between said arms.

25. The assembly of claim 24, characterized in that said module includes an alignment leg having an open yoke which is profiled to be received between the two arms and over the intermediate pinion portion.

26. The assembly of claim 22, characterized in that said pivot arm includes at an end thereof, a cupped section facing said insertion direction of said control module, and profiled to receive a stop lug at the leading end of said control module.

27. The assembly of claim 22 characterized in that said pivot arm includes lugs centered along said pivot axis, which are positioned in a trunnion located in said control box, and pivotally mounted therein.

28. The assembly of claim 27, characterized in that said control box includes at least one control module receiving slot defined by end walls and side walls, where said trunnion is located in the side walls and accessible from a vertical position above.

29. The assembly of claim 28, characterized in that said connector is pivotal between a position where a front mating face of said connector is vertical, to a position where said connector rests against said end wall.

30. The assembly of claim 19 characterized in that said connector pivots about said box along the same axis at which the connector pivots relative to said module.

* * * * *